United States Patent
Emira et al.

(10) Patent No.: US 11,190,141 B2
(45) Date of Patent: *Nov. 30, 2021

(54) VALLEY DETECTION FOR SUPPLY VOLTAGE MODULATION IN POWER AMPLIFIER CIRCUITS

(71) Applicant: SHENZHEN GOODIX TECHNOLOGY CO., LTD., Shenzhen (CN)

(72) Inventors: Ahmed Emira, San Diego, CA (US); Siavash Yazdi, San Diego, CA (US); Kaveh Moazzami, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/916,155

(22) Filed: Jun. 30, 2020

(65) Prior Publication Data

US 2020/0336112 A1 Oct. 22, 2020

Related U.S. Application Data

(63) Continuation of application No. 16/000,952, filed on Jun. 6, 2018, now Pat. No. 10,763,790.

(51) Int. Cl.
*H03G 3/20* (2006.01)
*H03F 1/02* (2006.01)
(Continued)

(52) U.S. Cl.
CPC .......... *H03F 1/0233* (2013.01); *G01R 19/14* (2013.01); *G01R 19/16538* (2013.01);
(Continued)

(58) Field of Classification Search
CPC ....... H03F 1/0233; G01R 19/14; G01R 19/28; G01R 19/16538; H03B 5/04; H03B 5/124
(Continued)

(56) References Cited

U.S. PATENT DOCUMENTS

| 6,141,541 A * | 10/2000 | Midya .................... H03F 1/0227 455/108 |
| 9,379,668 B1 | 6/2016 | Lerdworatawee et al. |
| 2009/0021303 A1 * | 1/2009 | Vinayak ................ H03F 1/0238 330/127 |

FOREIGN PATENT DOCUMENTS

| CN | 1663115 A | 8/2005 |
| CN | 101772887 A | 7/2010 |

(Continued)

OTHER PUBLICATIONS

Wei-Ting Lin et al.: "A 20MHz Low Dropout Controlled Current Sensor for Constant On-Time Based Envelope Tracking Supply Modulator for Radio Frequency Power Amplifier", 2018 IEEE International Symposium on Circuits and Systems (ISCAS), IEEE, May 27, 2018, pp. 1-4, XP033434579.

*Primary Examiner* — Khanh V Nguyen
*Assistant Examiner* — Khiem D Nguyen
(74) *Attorney, Agent, or Firm* — Kilpatrick Townsend & Stockton LLP (57) ABSTRACT

Techniques are described for using valley detection for supply voltage modulation in power amplifier circuits. Embodiments operate in context of a power amplifier circuit configured to be driven by a supply voltage generated by a supply modulator and to receive an amplitude-modulated (AM) signal at its input. The output of the power amplifier circuit can be fed to a valley detector that can detect a valley level corresponding to the bottom of the envelope of the AM signal. The detected valley level can be fed back to the supply modulator and compared to a constant reference. In (Continued)

response to the comparison, the supply modulator can vary the supply voltage to the power amplifier circuit in a manner that effectively tracking the envelope of the power amplifier circuit's output signal, thereby effectively seeking a flat valley for the output signal's envelope.

18 Claims, 6 Drawing Sheets

(51) Int. Cl.
  *H03B 5/04* (2006.01)
  *G01R 19/165* (2006.01)
  *G01R 19/14* (2006.01)
  *G01R 19/28* (2006.01)
  *H03B 5/12* (2006.01)

(52) U.S. Cl.
  CPC .............. *G01R 19/28* (2013.01); *H03B 5/04* (2013.01); *H03B 5/124* (2013.01)

(58) Field of Classification Search
  USPC ..................... 330/285, 297, 298, 136, 127
  See application file for complete search history.

(56) References Cited

FOREIGN PATENT DOCUMENTS

| CN | 103493368 A | 1/2014 |
| CN | 104170250 A | 11/2014 |
| CN | 107408926 A | 11/2017 |

* cited by examiner

VALLEY DETECTION FOR SUPPLY VOLTAGE MODULATION IN POWER AMPLIFIER CIRCUITS

FIELD OF THE INVENTION

The present invention relates generally to power amplifier circuits. More particularly, embodiments of the present invention relate to valley detection for supply voltage modulation in power amplifier circuits.

BACKGROUND OF THE INVENTION

Power amplifier circuits are commonly used in a variety of applications for a number of purposes, including to apply gain to a signal to generate an amplified output signal. In some applications, the power amplifier has a single-ended output, such that a single output signal is generated. In other applications, the power amplifier has a double-ended output, such that differential (e.g., complementary) output signals are generated. In many cases, the power amplifier is driven by a voltage supply generated by a voltage supply circuit.

In many conventional applications, the voltage supply circuit seeks to maintain a constant supply voltage to the power amplifier circuit. As an example, an amplitude-modulated (AM) signal can include a radiofrequency carrier signal modulated by a lower frequency signal that manifests a changing amplitude envelope. When such an AM signal is received by a conventional power amplifier application, maintaining the constant supply voltage to the power amplifier circuit can cause certain inefficiencies, such as power loss when the amplitude envelope is less than the supply voltage.

BRIEF SUMMARY OF THE INVENTION

Embodiments of the present invention provides circuits, devices, and methods for using valley detection for supply voltage modulation in power amplifier circuits. Embodiments operate in context of a power amplifier circuit configured to be driven by a supply voltage generated by a supply modulator and to receive an amplitude-modulated (AM) signal at its input. As used herein, an "amplitude-modulated" signal, or the like, can refer to a context in which supply modulation is used with a linear amplifier (e.g., where the amplitude and phase information are contained in one set of data contained in the signal), in which supply modulation is used with a polar amplifier (e.g., where an amplitude signal and a Phase signal are received separately), or in any other suitable context. The output (or outputs, in some differential cases) of the power amplifier circuit can be fed to a valley detector that can detect a valley level corresponding to the bottom of the envelope of the AM signal. The detected valley level can be fed back to the supply modulator and compared to a constant reference. In response to the comparison, the supply modulator can vary the supply voltage to the power amplifier circuit in a manner that effectively tracking the envelope of the power amplifier circuit's output signal, thereby effectively seeking a flat valley for the output signal's envelope. Some embodiments further detect whether the supply voltage is below a threshold minimum level (e.g., below which there may be insufficient headroom for components of the power amplifier circuit). Such embodiments can selectively track the supply voltage to the power amplifier circuit output envelope only when the supply voltage is above the threshold minimum level, and can allow the supply regulator to maintain a constant supply voltage otherwise.

According to one set of embodiments, a power amplifier system is provided. The system includes: a supply modulator circuit having a reference voltage input, a valley level input, and a supply output to output a supply voltage; a power amplifier circuit coupled with the supply output of the supply modulator circuit to receive the supply voltage, and having a signal input and a signal output, the signal output generated by applying a gain to the signal input according to the supply voltage; and a valley detector circuit having a detection input coupled with the signal output of the power amplifier circuit, and having a detection output coupled with the valley level input of the supply modulator circuit, the detection output generated as a function of the detection input substantially to track a valley level of an amplitude envelope of the signal output of the power amplifier circuit. The supply voltage is regulatable by the supply modulator circuit as a function of the reference voltage input and the valley level input substantially to track the amplitude envelope of the signal output of the power amplifier circuit.

According to another set of embodiments, another power amplifier system is provided. The system includes: means for generating an output signal by applying gain to an input signal and applying a common mode DC level to the output signal according to a supply voltage; and means for regulating the supply voltage to dynamically track an amplitude envelope of the output signal as a function of dynamically detecting a valley level of the output signal. Some such embodiments further include: means for detecting the valley level of the output signal; means for gating the means for regulating, such that the supply voltage dynamically tracks the amplitude envelope of the output signal only when the supply voltage is above a predetermined minimum supply voltage level; and/or means for limiting the gain applied to the input signal in response to detecting that the valley level is pushed below a predetermined minimum valley level.

According to another set of embodiments, a method is provided for supply voltage modulation in a power amplifier circuit. The method includes: receiving a supply voltage at the power amplifier circuit; generating, by the power amplifier circuit, an output signal by applying gain to an input signal, such that the output signal has a common mode DC level corresponding to the supply voltage; detecting a valley level of an amplitude envelope of the output signal; and regulating the supply voltage dynamically as a function of the valley level, such that the supply voltage dynamically tracks the amplitude envelope of the output signal.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
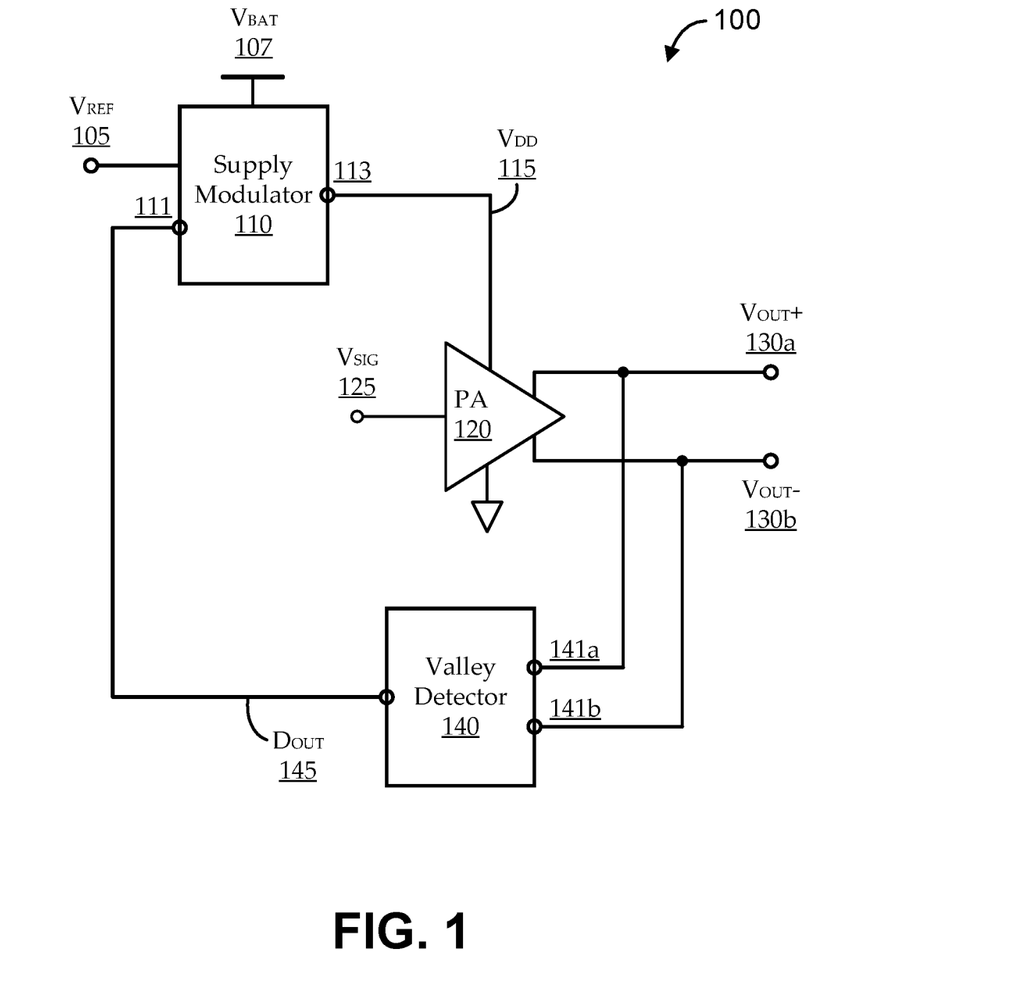
FIG. 1 shows an illustrative power amplifier system, according to various embodiments.

FIG. 1 shows an illustrative power amplifier system 100, according to various embodiments. For the sake of context, power amplifier circuits are commonly used in a variety of applications for a number of purposes, including to apply gain to a signal to generate an amplified output signal. Typically, the power amplifier is driven by a voltage supply generated by a voltage supply circuit. In many conventional implementations, the voltage supply circuit drives the power amplifier circuit with a constant supply voltage.

In many modern electronics applications, the power amplifier circuit is part of a signal communications system. For example, cellular telephones and other devices having wireless communication capabilities include a radio system having receivers and/or transmitters for communicating radiofrequency (RF) signals. Such signals can include an amplitude-modulated (AM) signal (e.g., a signal having only amplitude information, one or more signals having amplitude and phase information, etc.), for which information is encoded by modulating the amplitude (e.g., signal strength) of a signal communicated at a RF carrier frequency (e.g., alone, or in conjunction with, or in addition to, modulating the phase of the signal).

Figure 2:
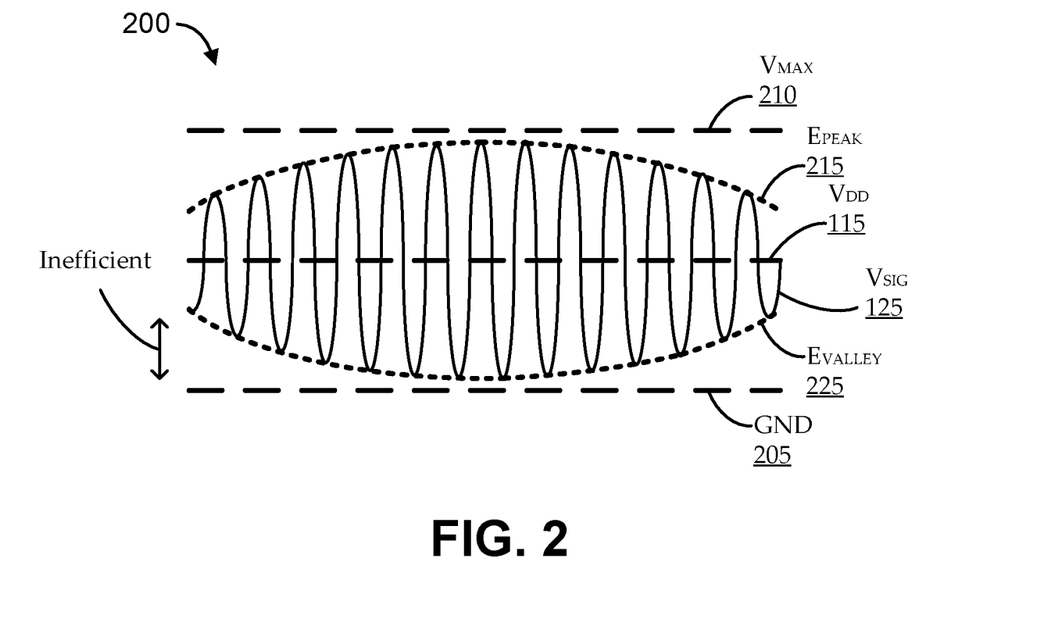
FIG. 2 shows an illustrative waveform of a portion of a radiofrequency (RF) amplitude-modulated (AM) signal.

As an example, FIG. 2 shows an illustrative waveform 200 of a portion of an RF AM signal. As illustrated, the RF signal ($V_{SIG}$) 125 is amplitude modulated, such that its amplitude follows an envelope. Some conventional envelope tracking power amplifiers can seek to provide a substantially constant supply voltage ($V_{DD}$) 115, around which the RF signal 125 is substantially symmetrical. For example, at any particular time, a peak of the envelope ($E_{PEAK}$) 215 and a valley of the envelope ($E_{VALLEY}$) 225 are substantially the same distance from $V_{DD}$ 115 and are between a maximum peak voltage ($V_{MAX}$) 210 and a ground level (GND) 205.

In such cases, driving a power amplifier circuit with a constant supply voltage can be inefficient, particularly for a power amplifier circuits with a high peak-to-average power ratio (PAPR). For example, power efficiency is often an important aspect of signal communications system design, and maintaining a constant supply voltage to the power amplifier circuit in an AM signal context can result in sub-optimal power efficiency (e.g., excessive headroom may be provided to various components when the RF signal envelope has a low amplitude). Accordingly, come conventional power amplifier circuits are configured as envelope tracking systems. In such systems, the supply voltage to the power amplifier circuit can be varied to track the modulated amplitude of the RF signal.

For example, some conventional approaches detect an envelope of the RF signal being input to the power amplifier circuit, estimate the gain expected to be applied to the RF signal by the power amplifier circuit, and adjust the supply voltage (e.g., according to a determined power amplifier gain code, or the like) in an attempt to maintain low headroom over the changing signal amplitude. While such approaches can be effective, their efficiency can often vary with process, voltage, and temperature (PVT) variations, and the like, such as differences in manufacturing tolerances and process variations for power amplifier circuits, power supply circuits, antennas, etc. Accordingly, some state-of-the-art approaches include additional, complex circuitry to mitigate such concerns. For example, some newer approaches rely on determining characteristics of various components during manufacturing, and selecting values in a look-up table (LUT) for setting circuit parameters to match the determined characteristics. Other newer approaches use complex circuitry (detection circuitry, including digital-to-analog converters (DACs), and other components) to characterize components during operation of the circuits and automatically to select values in a LUT for setting circuit parameters to match the determined characteristics.

Embodiments described herein follow a novel approach relying on using valley detection to inform supply voltage modulation in power amplifier circuits. For example, embodiments regulate the supply voltage to the power amplifier circuit by comparing a valley level of the amplitude envelope of the power amplifier's output signal to a constant reference level. This can cause the regulated supply voltage effectively to track the envelope of the output signal, which can substantially flatten out the valley of the envelope. Such an approach provides a number of features. One such feature is that flattening out the valley can tend to avoid inefficiently providing excessive headroom to components of the power amplifier circuit. Another such feature is that the novel approach performs envelope tracking based on the output of the power amplifier circuit, rather than on the input. As such, the detection is substantially agnostic to (e.g., are not impacted by and/or compensate for) PVT variations in the power amplifier circuit.

Returning to FIG. 1, the power amplifier system 100 includes a supply modulator circuit 110, a power amplifier circuit 120, and a valley detector circuit 140. Embodiments of the supply modulator circuit 110 include a reference voltage input 105, a valley level input 111, and a supply output 113 to output a supply voltage ($V_{DD}$) 115. As described below, the supply output 113 is generated as a function of the reference voltage input 105 and the valley level input 111. For example, in some embodiments, the supply modulator circuit 110 includes an operational amplifier having a negative input coupled with the reference voltage input 105, a positive input coupled with the valley level input 111, and an output coupled with the supply output 113.

Embodiments of the power amplifier circuit 120 are coupled with the supply output 113 of the supply modulator circuit 110 to receive the supply voltage 115. The power amplifier circuit 120 is driven by the supply voltage 115, accordingly. The power amplifier circuit 120 has a signal input 125 and a signal output 130. The signal output 130 is generated by applying a gain to the signal input 125 according to the supply voltage 115. In some embodiments, the power amplifier circuit 120 has a double-ended output, such that the signal output 130 includes a first signal output 130a and a second signal output 130b. For example, the power amplifier circuit 120 can be a differential-output power amplifier, such that the first signal output 130a and the second signal output 130b are a differential pair (e.g., the output signals at the first and second signal outputs 130 are complementary). While various embodiments are illustrated herein in context of power amplifier circuits 120 having differential outputs, embodiments can be implemented using power amplifier circuits 120 having a single-ended output (i.e., having a single signal output 130). In such embodiments, for example, the valley detector circuit 140 can be coupled with the single signal output 130. In some implementations, the power amplifier circuit 120 is a linear power amplifier. In other implementations, the power amplifier circuit 120 is a polar power amplifier.

Embodiments of the valley detector circuit 140 include a detection input 141 coupled with the signal output 130 of the power amplifier circuit 120. In cases where the power amplifier circuit 120 has multiple (e.g., differential) signal outputs 130, the valley detector circuit 140 can include multiple corresponding detection inputs 141. The valley detector circuit 140 can also include a detection output 145 coupled with the valley level input 111 of the supply modulator circuit 110. The detection output 145 can be generated as a function of the detection input(s) 141 substantially to track a valley level of an amplitude envelope of the signal output 130 of the power amplifier circuit 120. In some implementations, the detection output 145 is the valley level. In other implementations, the detection output 145 is a signal corresponding to (i.e., indicating) the valley level.

Figure 8:
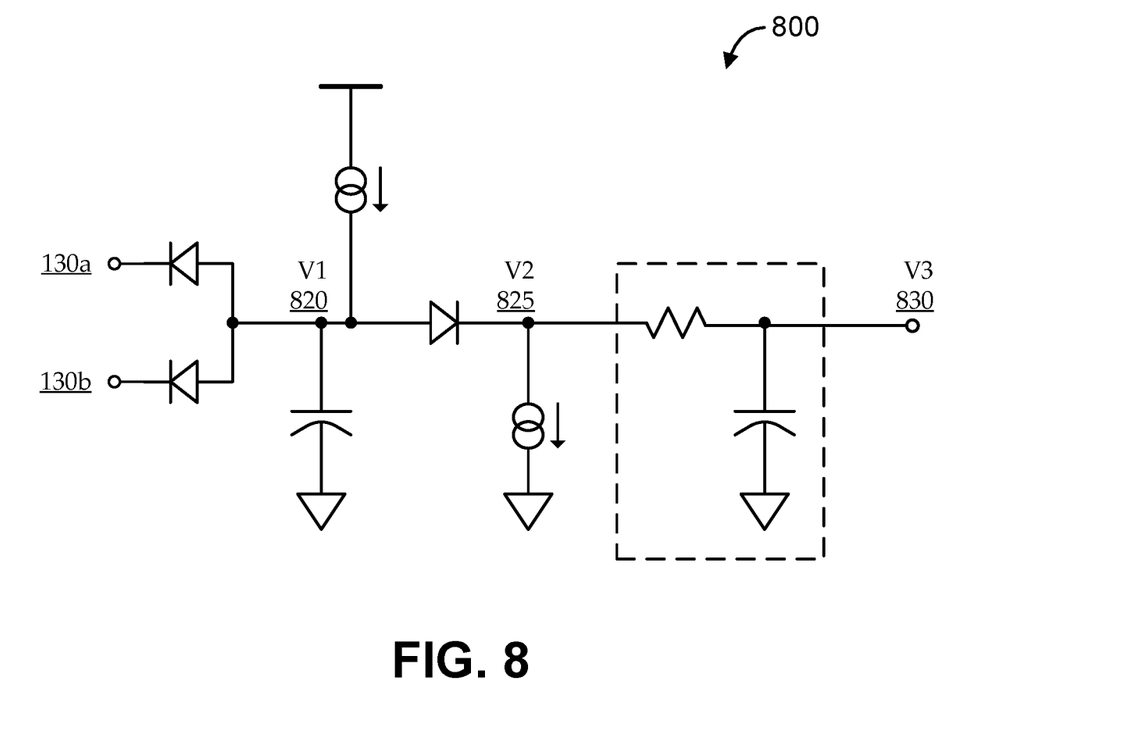
FIG. 8 shows an illustrative valley detector, according to various embodiments.

Some embodiments of the valley detector circuit 140 directly detects the valley level of the amplitude envelope of the signal output 130 of the power amplifier circuit 120. FIG. 8 shows an illustrative valley detector 800, according to various embodiments. The valley detector 800 can be an implementation of valley detector circuit 140 of FIG. 1. As illustrated, the signal output 130 (or signal outputs 130a and 130b, in differential cases) of the power amplifier circuit 120 are inputs to the valley detector 800. Each input (corresponding to a signal output 130) is coupled across an input diode to a node that is between a current source and a capacitor. Accordingly, that node (the voltage across the capacitor, illustrated as V1 820) is effectively the valley level plus the input diode voltage drop. The V1 820 node is coupled, across a subtraction diode, to another node labeled V2 825. Another current source is coupled between the V2 825 node and ground (to pass a constant current through the subtraction diode), such that the voltage at V2 825 is effectively the voltage at V1 820 minus the voltage drop across the subtraction diode, which is approximately the valley level (i.e., V1 is approximately the valley level plus a diode voltage drop, and V2 is approximately V1 minus a diode voltage drop; so V2 is approximately the valley level). In some implementations, the V2 825 node can be coupled with a low-pass filter to generate a filtered output voltage, labeled V3 830. The output of the valley detector 800 (e.g., which can correspond to $D_{OUT}$ 145 of FIG. 1) can be V2 825, V3 830, or any other suitable voltage corresponding to V2 825 or V3 830. Other embodiments of the valley detector circuit 140 can include a peak detection circuit to detect a peak level and a high frequency AC signal amplitude of the signal output 130 of the power amplifier circuit. In such embodiments, the valley detector circuit 140 generates the detection output according to a difference between the peak level and high frequency AC signal amplitude.

Embodiments of the power amplifier system 100 operate, such that the supply voltage 115 is regulatable by the power amplifier circuit 120 as a function of the reference voltage input 105 and the valley level input 111 substantially to track the amplitude envelope of the signal output 130 of the power amplifier circuit 120. For example, as the peak of the envelope of the signal output 130 increases, the power amplifier circuit 120 draws more current. This can cause the supply voltage 115 to decrease and can cause the valley of the envelope to be pushed down (e.g., as generally illustrated in FIG. 2). The valley detector circuit 140 can detect that the valley of the envelope is being pushed down relative to the supply voltage 115, and the valley detector circuit 140 can decrease the voltage level at the valley level input 111 of the supply modulator circuit 110, accordingly. This can cause the supply modulator circuit 110 to increase the supply voltage 115 to compensate, which can effectively raise the valley level of the envelope of the signal output 130 (i.e., the valley level is the same distance from the supply voltage 115 level; so raising the supply voltage 115 level can effectively raise the valley level.

Figure 3:
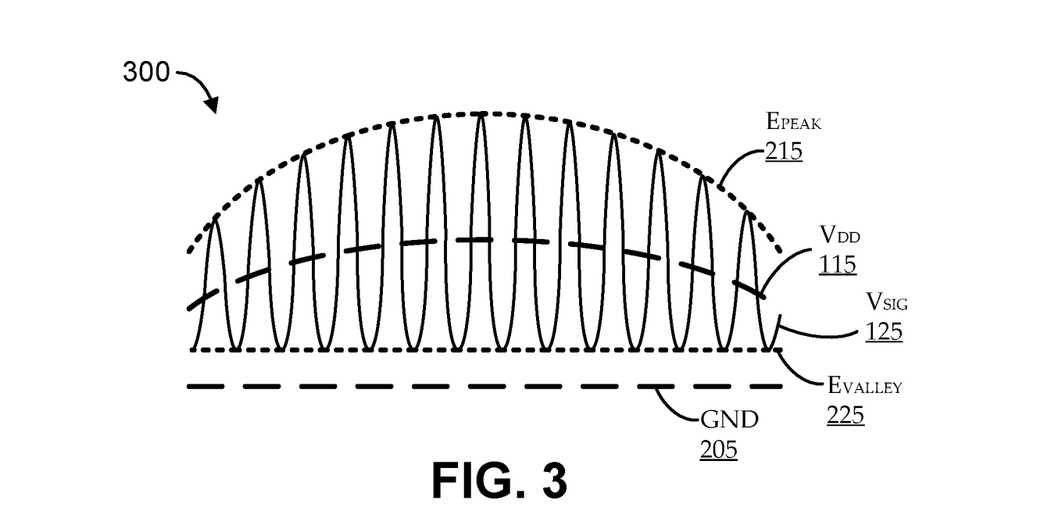
FIG. 3 shows an illustrative waveform of a portion of an RF AM signal using the novel type of envelope tracking described herein.

In this way, the supply voltage 115 to the power amplifier circuit 120 effectively becomes a common mode offset to the signal output 130 that tracks the envelope of the signal output 130. For the sake of illustration, FIG. 3 shows an illustrative waveform 300 of a portion of an RF AM signal using the novel type of envelope tracking described herein. The illustrated waveform 300 can be an example of an output seen at one of the signal outputs 130 of the power amplifier circuit 120 of FIG. 1. As in FIG. 2, the RF signal ($V_{SIG}$) 125 is amplitude modulated, such that its amplitude follows an envelope, and the RF signal 125 is substantially symmetrical around the supply voltage ($V_{DD}$) 115. Unlike FIG. 2, however, the supply voltage 115 substantially tracks the changing envelope of the RF signal 125. As illustrated, regulating the supply voltage 115 in this way tends effectively to double the peak of the envelope ($E_{PEAK}$) 215 and to flatten out the valley of the envelope ($E_{VALLEY}$) 225.

As described above, one feature of such an approach is that the flattened out valley tends to avoid inefficiently providing excessive headroom to components (e.g., of the power amplifier circuit 120). However, it can be desirable to provide at least a minimum amount of headroom to such components. For example, dropping the supply voltage 115 too low can cause transistors and other components to begin operating in non-linear and/or otherwise undesirable modes. As such, embodiments can be configured so that the flattened $E_{VALLEY}$ 225 level remains some amount above the ground level (GND) 205. For example, embodiments can be designed to regulate the supply voltage 115 so that $E_{VALLEY}$ 225 stays substantially at 1 volt, 1.5 volts, or the like.

Figure 4:
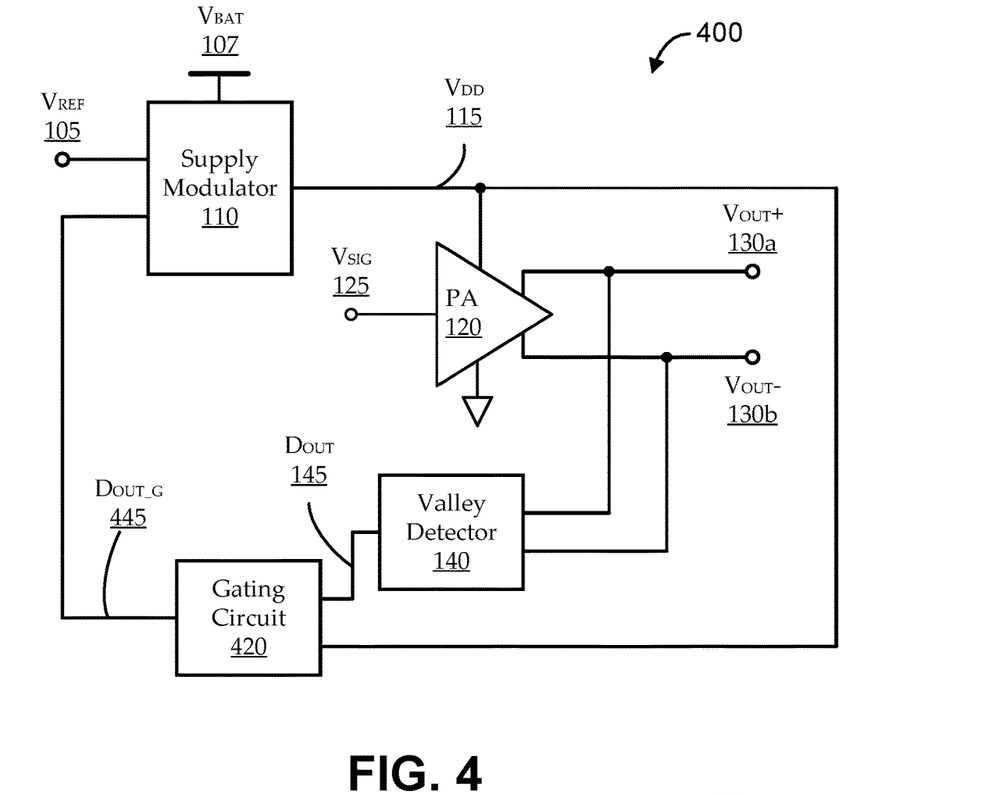
FIG. 4 shows a circuit block diagram of an illustrative power amplifier system having gating, according to various embodiments.

Some embodiments provide additional features for maintaining headroom for components. FIG. 4 shows a circuit block diagram of an illustrative power amplifier system 400 having gating, according to various embodiments. As illustrated, the power amplifier system 400 is substantially the same as the power amplifier system 100 of FIG. 1, with the addition of a gating circuit 420. Embodiments of the gating circuit 420 are coupled with the valley detector circuit 140 and have a gated detection output 445. The gated detection output 445 can be generated, to correspond to the detection output 145 of the valley detector circuit 140 when the supply voltage 115 is above a predetermined minimum supply voltage level. For example, while the supply voltage 115 remains above the predetermined minimum supply voltage level, the gating circuit 420 can effectively pass through the detection output 145. When the supply voltage 115 drops to the predetermined minimum supply voltage level, embodiments of the gating circuit 420 can generate the gated detection output 445 to cause the supply modulator circuit 110 to maintain the supply voltage 115 at a substantially constant level corresponding to the predetermined minimum supply voltage level. For example, due to the gating circuit 420, the supply voltage 115 can be regulated to substantially track the envelope of the signal output 130 (i.e., to flatten the valley level of the envelope) only while the supply voltage 115 remains above the predetermined minimum supply voltage level; and not otherwise.

Figure 5:
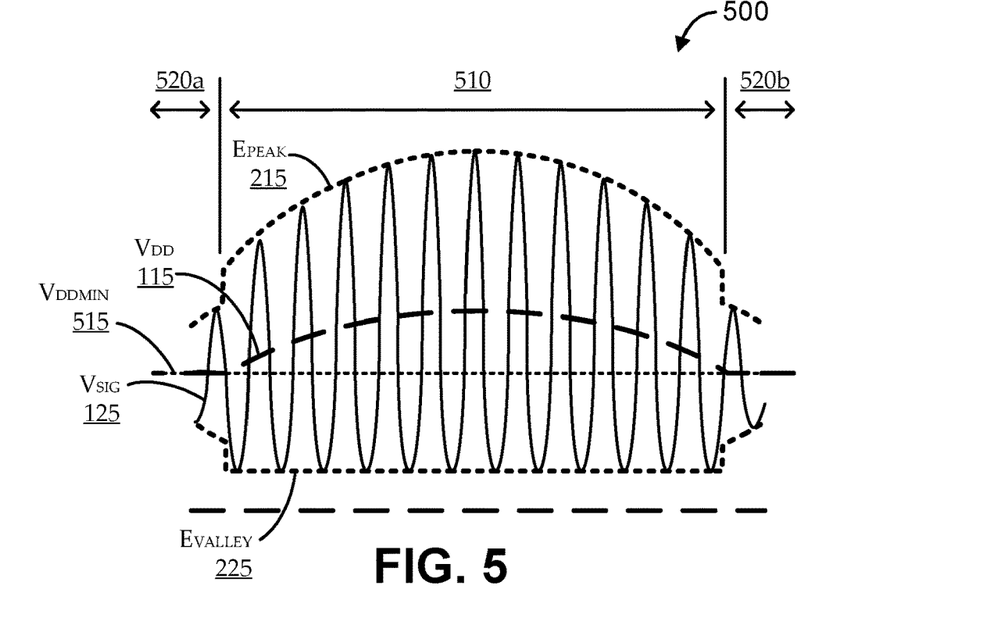
FIG. 5 shows an illustrative waveform of a portion of an RF AM signal using gated envelope tracking.

For the sake of illustration, FIG. 5 shows an illustrative waveform 500 of a portion of an RF AM signal using gated envelope tracking. The illustrated waveform 500 can be an example of an output seen at one of the signal outputs 130 of the power amplifier circuit 120 of FIG. 4. As illustrated, there are some periods of time during which the supply voltage 115 remains above a predetermined minimum supply voltage level ($V_{DDMIN}$) 515 (indicated by time period 510), and other periods of time during which the supply voltage 115 drops to $V_{DDMIN}$ 515 (indicated by time periods 520). It can be assumed that, if not for the gating described with reference to FIG. 4, the supply voltage 115 may be allowed to drop below $V_{DDMIN}$ 515 during time periods 520. Because of the gating, however, the supply voltage 115 is regulated in a manner that holds it substantially constant during time periods 520, which effectively ceases to flatten the valley during time periods 520. In effect, the resulting RF signal 125 looks similar to the waveform 300 of FIG. 3 during time period 510, and the resulting RF signal 125 looks similar to the waveform 200 of FIG. 2 during time periods 520.

As described above, the novel tracking approaches described herein can increase power efficiency by effectively flattening the valley of the amplitude envelope of the power amplifier circuit 120 output. In the embodiments of FIGS. 4 and 5, the novel tracking approach is used only some of the time. However, the times during which the tracking is not being used corresponds to the times when the output signal amplitude is relatively low, such that there is a relatively small amount of power loss due to tracking inefficiencies during these times.

In some cases, the valley level of the envelope can also be pushed down when the power amplifier circuit 120 applies excessive gain to the input signal. As described above, the supply modulator circuit 110 is driven by a source voltage 107, and the supply voltage 115 that is output by the supply modulator circuit 110 is limited by the source voltage 107. Because the power amplifier circuit 120 is driven by the supply voltage 115, and the supply voltage 115 is limited by the source voltage 107, the peak amplitude of the output signal is similarly limited (e.g., to twice the source voltage 107, or some small delta below that). As described above, the output signal of the power amplifier circuit 120 is substantially symmetrical around the supply voltage 115 (e.g., the supply voltage 115 is substantially the average of the envelope magnitude at any time). As such, if the power amplifier circuit 120 applies an amount of gain to the input signal that causes the output signal peak to exceed the peak amplitude, this may tend to push down the supply voltage 115 level; reducing the supply voltage 115 level effectively increases the distance between the peak and the supply voltage 115, when the peak cannot increase beyond the maximum peak level. This can also push down the valley level. As described above, it can be undesirable for the valley level to be pushed down below a minimum level. Accordingly, some embodiments include pushdown detection functionality.

Figure 6:
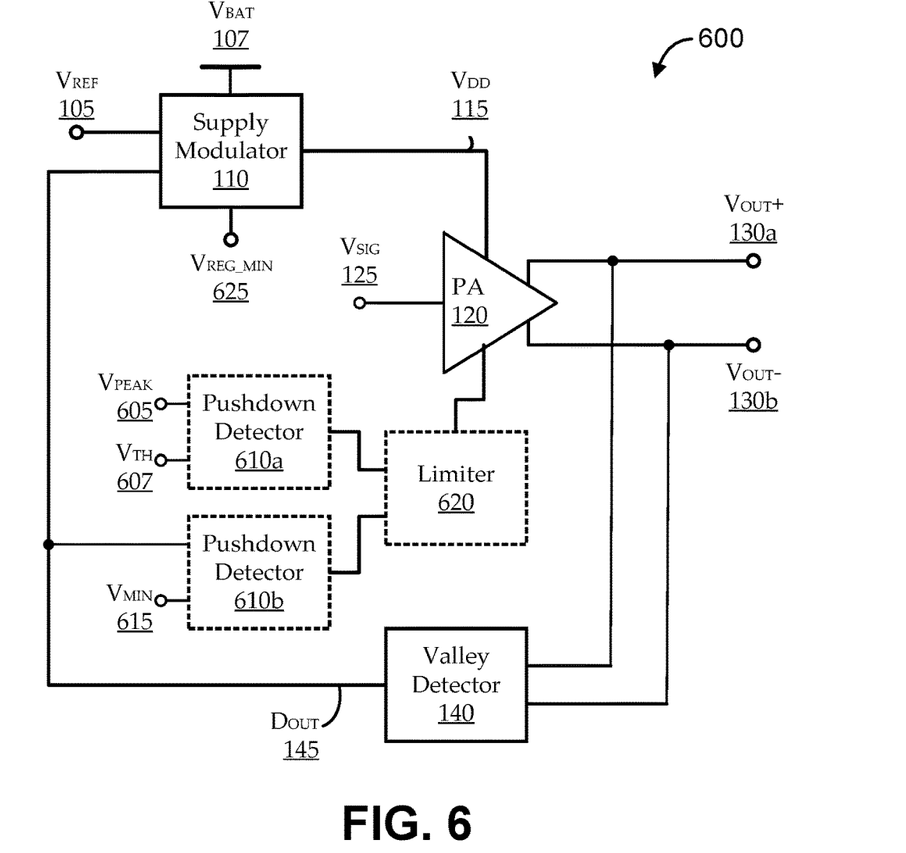
FIG. 6 shows a circuit block diagram of an illustrative power amplifier system having pushdown detection, according to various embodiments.

FIG. 6 shows a circuit block diagram of an illustrative power amplifier system 600 having pushdown detection, according to various embodiments. As illustrated, the power amplifier system 600 is substantially the same as the power amplifier system 100 of FIG. 1, with the addition of a pushdown detector 610 and a limiter 620. Embodiments of the pushdown detector 610 detect whether the valley level is pushed below a predetermined minimum valley level. Embodiments of the limiter 620 are coupled with the pushdown detector 610 and the power amplifier circuit 120 to limit the gain applied to the signal input 125 in response to the pushdown detector 610 detecting that the valley level is pushed below the predetermined minimum valley level. For example, in response to detecting that the valley level is pushed below the predetermined minimum valley level, the limiter 620 can direct the power amplifier circuit 120 to reduce the gain being applied. In some implementations, the power amplifier circuit 120 applies gain according to a gain code, and the limiter 620 can direct the power amplifier circuit 120 to reduce the gain being applied by directing it to back off the gain code.

The pushdown detection can be implemented in various ways. In some implementations, the pushdown detector 610 has a pushdown input coupled with the detection output 145 of the valley detector circuit (e.g., or the gated detection output 445 of a gating circuit 420) and a minimum valley level input ($V_{MIN}$) 615 corresponding to the predetermined minimum valley level. Such implementations can detect whether the valley level is pushed below the predetermined minimum valley level by comparing the pushdown input with the minimum valley level input 615. In other implementations, the pushdown detector 610 includes a first pushdown input ($V_{PEAK}$) 605 to receive a peak level of the signal output of the power amplifier circuit 120, and a second pushdown input ($V_{TH}$) 607 to receive a predetermined maximum peak level corresponding to twice the source voltage 107 (e.g., twice the source voltage 107 minus a predetermined small delta). Such implementations can indirectly detect whether the valley level is pushed below the predetermined minimum valley level by comparing $V_{PEAK}$ 605 to $V_{TH}$ (e.g., the valley level is apparently pushed below the predetermined minimum valley level when $V_{PEAK}$ 605≥$V_{TH}$). Other techniques can be used to determine when the valley level is apparently pushed below the predetermined minimum valley level. For example, the valley level can be determined as pushed below the predetermined minimum valley level by detecting when a peak of the RF signal (i.e., the difference between peak of the envelope and the valley of the envelope) reaches or exceeds a maximum envelope signal peak level (e.g., twice the source voltage minus a predetermined small delta minus the regulated valley level). As another example, the valley level can be determined as pushed below the predetermined minimum valley level by detecting when a peak of the supply voltage 115 reaches or exceeds a maximum supply peak level (e.g., half of the sum of the regulated valley level and twice the source voltage minus a predetermined small delta).

Figure 7:
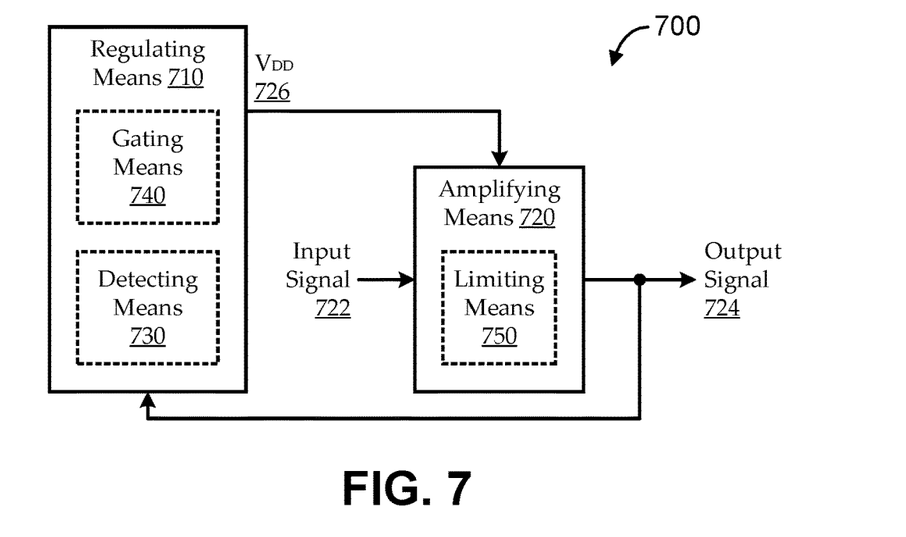
FIG. 7 shows a block diagram of an illustrative power amplifier system, according to various embodiments.

FIG. 7 shows a block diagram of an illustrative power amplifier system 700, according to various embodiments. The power amplifier system 700 includes a regulating means 710 and an amplifying means 720. As described herein, the amplifying means 720 can include any suitable means for amplifying an output signal 724 by applying gain to an input signal 722 and applying a common mode offset to the output signal 724 according to a supply voltage ($V_{DD}$) 726. For example, the amplifying means 720 can include a linear or polar power amplifier having a single-ended output or a differential pair of outputs. The regulating means 710 can include any suitable means for regulating the supply voltage 726 to dynamically track an amplitude envelope of the output signal 724 as a function of dynamically detecting a valley level of the output signal 724.

In some embodiments, the regulating means 710 includes detecting means 730 for detecting the valley level of the output signal 724. The detecting means 730 can include any suitable means, such as circuitry to directly or indirectly detect the valley level of the output signal 724. Some embodiments of the regulating means 710 can also include gating means 740. The gating means 740 can include any suitable means for gating regulating functions of the regulating means 710, such that the supply voltage 726 dynamically tracks the amplitude envelope of the output signal 724 only when the supply voltage 726 is above a predetermined minimum supply voltage level. Some embodiments of the amplifying means 720 include limiting means 750. The limiting means 750 can include any suitable means for limiting the gain applied to the input signal 722 in response to detecting that the valley level is pushed below a predetermined minimum valley level. Some implementations of the limiting means 750 are coupled with the detecting means 730 to receive the valley level therefrom, and to determine when the valley level is pushed below a predetermined minimum valley level, accordingly. Other implementations of the detecting means determine when the valley level is pushed below a predetermined minimum valley level in other ways.

Figure 9:
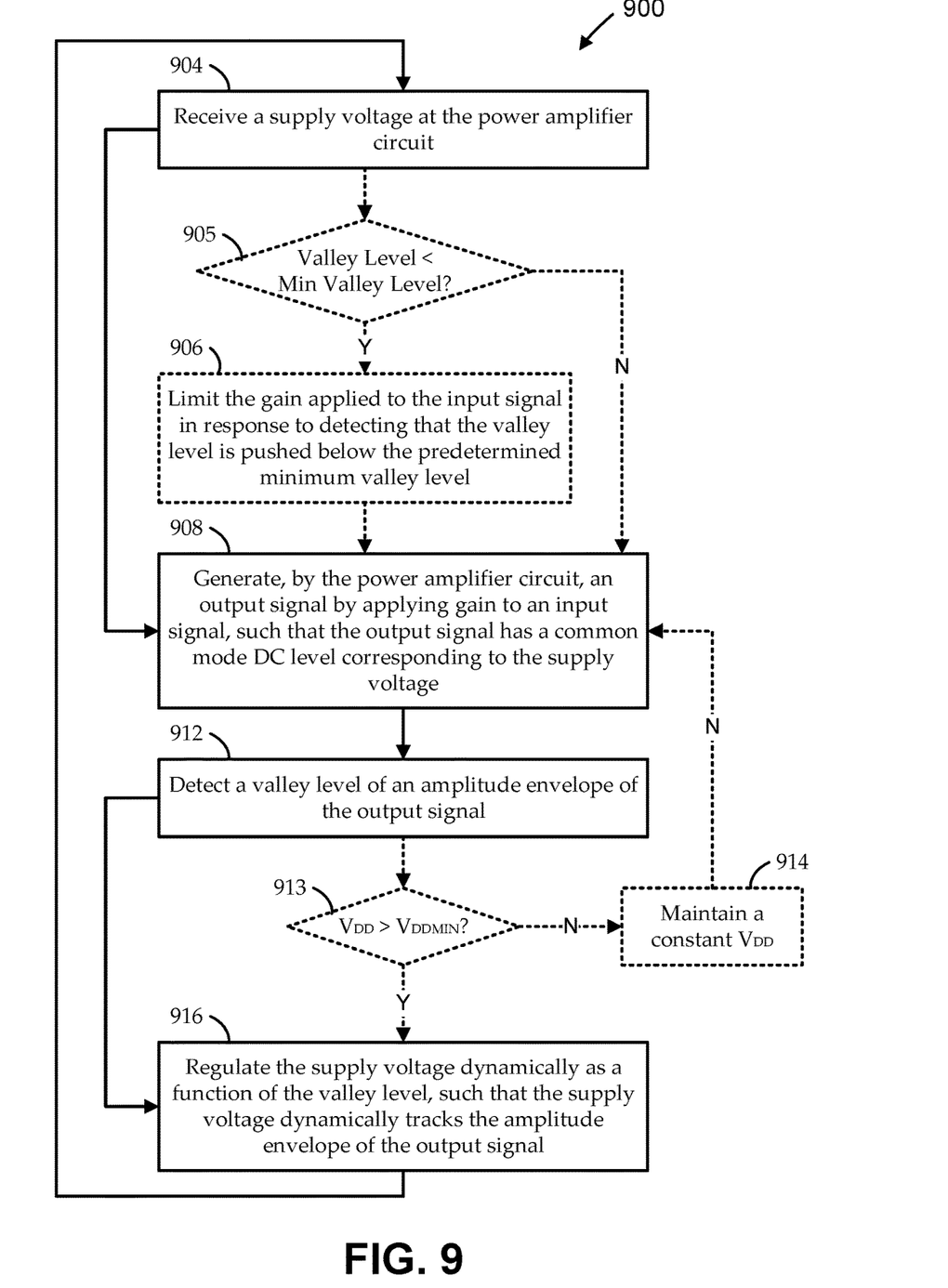
FIG. 9 shows a flow diagram of an illustrative method for supply voltage modulation in a power amplifier circuit, according to various embodiments.

FIG. 9 shows a flow diagram of an illustrative method 900 for supply voltage modulation in a power amplifier circuit, according to various embodiments. Embodiments of the method begin at stage 904 by receiving a supply voltage at the power amplifier circuit. At stage 908, embodiments can generate, by the power amplifier circuit, an output signal by applying gain to an input signal, such that the output signal has a common mode DC level corresponding to the supply voltage. In some embodiments, at stage 905, a determination is made as to whether the valley level is pushed below a predetermined minimum valley level. For example, when the power amplifier circuit attempts to apply an amount of gain to the input signal that causes the peak of the output signal to exceed a maximum supply voltage (e.g., a little less than twice the source voltage for the supply regulator, such as a battery voltage), this can cause the valley to be pushed down to make room. Such embodiments can proceed to generating the output signal in stage 908 without limits on gain only when the determination at stage 905 is that the valley level is not pushed below the predetermined minimum valley level. If the determination at stage 905 is that the valley level is pushed below the predetermined minimum valley level, embodiments can, at stage 906, limit the gain applied to the input signal in response thereto.

At stage 912, embodiments can detect a valley level of an amplitude envelope of the output signal. In some embodiments, the detecting includes directly detecting the valley level of the amplitude envelope of the signal output of the power amplifier circuit. In other embodiments, the detecting includes detecting a peak level of the output signal, and detecting the valley level indirectly by detecting a difference between the supply voltage and the peak level.

At stage 916, embodiments can regulate the supply voltage dynamically as a function of the valley level, such that the supply voltage dynamically tracks the amplitude envelope of the output signal. In some embodiments, the regulating includes comparing the valley level with a fixed reference voltage level, such that the supply voltage is generated as a function of the comparing. Some embodiments, at stage 913, make a determination as to whether the supply voltage is above a predetermined minimum supply voltage level. Such embodiments may proceed to regulate at stage 916 (e.g., such that the supply voltage dynamically tracks the amplitude envelope of the output signal) only when the determination at stage 913 is that the supply voltage is above a predetermined minimum supply voltage level. Otherwise, embodiments can maintain a substantially constant supply voltage (e.g., at or near the minimum supply voltage) at stage 914.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A power amplifier system comprising:
    a supply modulator circuit having a reference voltage input, a valley level input, and a supply output to output a supply voltage;
    a power amplifier circuit coupled with the supply output of the supply modulator circuit to receive the supply voltage, and having a signal input and a signal output, the signal output being one of a differential pair of signal outputs generated by applying a gain to the signal input according to the supply voltage; and
    a valley detector circuit having a first detection input coupled with a first of the differential pair of signal outputs, a second detection input coupled with a second of the differential pair of signal outputs, and having a detection output coupled with the valley level input of the supply modulator circuit, a detection signal at the detection output generated as a function of the first and second detection inputs substantially to track a valley level of an amplitude envelope of the signal output of the power amplifier circuit,
    wherein the supply voltage is regulatable by the supply modulator circuit as a function of the reference voltage input and the valley level input substantially to track the amplitude envelope of the signal output of the power amplifier circuit.

2. The power amplifier system of claim 1, wherein the valley detector circuit directly detects the valley level of the amplitude envelope of the signal output of the power amplifier circuit.

3. The power amplifier system of claim 1, wherein the valley detector circuit comprises:
    a supply input corresponding to a supply level of the supply voltage; and
    a peak detection circuit to detect a peak level of the signal output and a high frequency AC amplitude level of the power amplifier circuit,
    wherein the valley detector circuit generates the detection output according to a difference between the peak level and the high frequency AC amplitude level.

4. The power amplifier system of claim 1, further comprising:
    a gating circuit coupled with the valley detector circuit and having a gated detection output generated, such that:
    the gated detection output corresponds to the detection output when the supply voltage is above a predetermined minimum supply voltage level; and
    the gated detection output causes the supply modulator circuit to maintain the supply voltage at a level corresponding to the predetermined minimum supply voltage level otherwise.

5. The power amplifier system of claim 1, further comprising:
    a pushdown detector circuit to detect whether the valley level is pushed below a predetermined minimum valley level; and
    a limiter circuit coupled with the pushdown detector circuit and the power amplifier circuit to limit the gain applied to the signal input in response to the pushdown detector circuit detecting that the valley level is pushed below the predetermined minimum valley level.

6. The power amplifier system of claim 5, wherein the pushdown detector circuit comprises a pushdown input coupled with the detection output of the valley detector circuit to detect whether the valley level is pushed below a predetermined minimum valley level by comparing the pushdown input with the predetermined minimum valley level.

7. The power amplifier system of claim 5, wherein:
    the supply modulator circuit is driven by a source voltage; and
    the pushdown detector circuit comprises a first pushdown input to receive a peak level of the signal output of the power amplifier circuit, and a second pushdown input to receive a predetermined maximum peak level corresponding to twice the source voltage,
    wherein the pushdown detector circuit is to detect whether the valley level is pushed below a predetermined minimum valley level by comparing the first and second pushdown inputs.

8. The power amplifier system of claim 1, wherein the power amplifier circuit is a polar power amplifier circuit.

9. A power amplifier system comprising:
    means for amplifying an output signal by applying gain to an input signal and applying a common mode DC level to the output signal according to a supply voltage, the output signal generated as one of a differential pair of signal outputs; and
    means for regulating the supply voltage to dynamically track an amplitude envelope of the output signal as a function of dynamically detecting a valley level of the output signal based on a pair of detection inputs coupled with the differential pair of signal outputs.

10. The power amplifier system of claim 9, wherein the means for regulating further comprise:
    means for detecting the valley level of the output signal.

11. The power amplifier system of claim 9, wherein the means for regulating further comprise:
    means for gating the means for regulating, such that the supply voltage dynamically tracks the amplitude envelope of the output signal only when the supply voltage is above a predetermined minimum supply voltage level.

12. The power amplifier system of claim 9, wherein the means for amplifying further comprise:
    means for limiting the gain applied to the input signal in response to detecting that the valley level is pushed below a predetermined minimum valley level.

13. A method for supply voltage modulation in a power amplifier circuit, the method comprising:
    receiving a supply voltage at the power amplifier circuit;
    generating, by the power amplifier circuit, an output signal by applying gain to an input signal, such that the output signal is generated as one of a differential pair of signal outputs and has a common mode offset corresponding to the supply voltage;
    detecting a valley level of an amplitude envelope of the output signal as a function of the differential pair of signal outputs; and regulating the supply voltage dynamically as a function of the valley level, such that the supply voltage dynamically tracks the amplitude envelope of the output signal.

14. The method of claim 13, wherein the regulating comprises comparing the valley level with a fixed reference voltage level, such that the supply voltage is generated as a function of the comparing.

15. The method of claim 13, wherein the detecting comprises directly detecting the valley level of the amplitude envelope of the signal output of the power amplifier circuit.

16. The method of claim 13, wherein the detecting comprises:
   detecting a peak level and a high frequency AC amplitude level of the output signal; and
   detecting the valley level indirectly by detecting a difference between the peak level and the high frequency AC amplitude level.

17. The method of claim 13, further comprising:
   gating the regulating, such that the supply voltage dynamically tracks the amplitude envelope of the output signal only when the supply voltage is above a predetermined minimum supply voltage level.

18. The method of claim 13, further comprising:
   detecting the valley level is pushed below a predetermined minimum valley level; and
   limiting the gain applied to the input signal in response to detecting that the valley level is pushed below the predetermined minimum valley level.

* * * * *